United States Patent
Benner, Jr.

(10) Patent No.: US 9,244,273 B2
(45) Date of Patent: Jan. 26, 2016

(54) Z-AXIS FOCUSING BEAM BRUSH DEVICE AND ASSOCIATED METHODS

(71) Applicant: William R. Benner, Jr., Longwood, FL (US)

(72) Inventor: William R. Benner, Jr., Longwood, FL (US)

(*) Notice: Subject to any disclaimer, the term of this patent is extended or adjusted under 35 U.S.C. 154(b) by 208 days.

(21) Appl. No.: 14/182,469

(22) Filed: Feb. 18, 2014

(65) Prior Publication Data

US 2014/0253994 A1    Sep. 11, 2014

Related U.S. Application Data

(60) Provisional application No. 61/774,763, filed on Mar. 8, 2013.

(51) Int. Cl.

| | | |
|---|---|---|
| G02B 26/08 | (2006.01) | |
| G02B 26/12 | (2006.01) | |
| G02B 5/122 | (2006.01) | |
| G02B 5/126 | (2006.01) | |
| G03F 7/20 | (2006.01) | |
| G02B 27/00 | (2006.01) | |
| G02B 26/10 | (2006.01) | |

(52) U.S. Cl.
CPC ............ G02B 26/124 (2013.01); G02B 5/122 (2013.01); G02B 5/126 (2013.01); G02B 26/101 (2013.01); G02B 26/108 (2013.01); G02B 27/0031 (2013.01); G03F 7/704 (2013.01); *G02B 26/10* (2013.01)

(58) Field of Classification Search
CPC .... G02B 26/101; G02B 26/105; G02B 26/10; G02B 26/108; G02B 26/124; G02B 27/0031; G02B 5/12; G02B 5/122; G02B 5/126; G03F 7/704
See application file for complete search history.

(56) References Cited

U.S. PATENT DOCUMENTS

| | | | |
|---|---|---|---|
| 5,200,797 A * | 4/1993 | Tank | G01B 9/02 356/510 |
| 5,621,561 A | 4/1997 | Belfatto et al. | |
| 6,079,833 A | 6/2000 | Kaelin et al. | |
| 6,580,560 B1 | 6/2003 | Benner | |
| 8,254,045 B1 | 8/2012 | Benner | |

* cited by examiner

*Primary Examiner* — James Phan
(74) *Attorney, Agent, or Firm* — Carl M. Napolitano; Gray Robinson, P.A.

(57) ABSTRACT

A beam brush includes one lens fixed for receiving a laser beam propagating along a first beam axis, a retroreflector positioned for redirecting the laser beam onto a second beam axis through a change in beam path length, and a second lens transmitting the redirected beam. The retroreflector is rotatable about an offset axis and has its angle of rotation controlled for affecting a change in beam path length. The angle of rotation resulting in the path length change is selected for providing a focus or divergence of the reflected beam transmitted through the second lens. Such a system is useful as a Z-axis focusing device operable an X-Y scanner located downstream the modified beam.

30 Claims, 8 Drawing Sheets

Z-AXIS FOCUSING BEAM BRUSH DEVICE AND ASSOCIATED METHODS

CROSS REFERENCE TO RELATED APPLICATION

This application claims priority to U.S. Provisional Patent Application No. 61/774,763 filed on Mar. 8, 2013 for Z-Axis Focusing Beam Brush Device and Associated Methods, the disclosure of which is hereby incorporated by reference herein in their entirety, and commonly owned.

FIELD OF THE INVENTION

The present invention generally relates to optical devices and in particular to a device and method for rapidly and precisely changing the focus or divergence of an incoming light beam.

BACKGROUND

Lasers are used in a variety of fields, from surveying, to supermarket bar-code scanners, and to optical disk drives such as CD and DVD drives, by way of examples. One particular class of laser application involves scanning the laser beam using X-Y galvanometer scanners for the purpose of marking or cutting material, or for the purpose of creating a visual image.

When lasers are used for marking or cutting, it is typical that the laser beam is deflected by X and Y scanners, and then sent through a "scan lens," which is usually implemented as an F-Theta lens or as a Telecentric lens. Such a lens is used to focus the laser beam onto the material being marked or cut. Normally the beam diameter exiting from the laser source is between 6 and 12 mm, and it is necessary to focus the beam onto the material to achieve a high enough energy density in order to mark or cut the material.

The scan lens, such as the F-Theta lens or the Telecentric lens, is typically a significant part of the cost of the overall laser marking system. The scan lens generally must be two to four inches in diameter, and is often made of exotic materials in order to pass the wavelength of interest. Moreover, the F-Theta and Telecentric lenses create a focus that is onto a planar target. So this means that the material being marked or cut must be flat, so that the beam will remain in focus all along the material's surface. It is typically not achievable or practical to mark onto a non-uniform surface such as a cylindrical soda can or wavy product. This planar and non-changeable focus distance and the typically high cost of the scan lens are two disadvantages of using scan lenses. It is therefore desirable to have a system that provides a dynamic focus while the beam is being scanned so that non-uniform surfaces can be marked.

Another application for lasers includes laser displays. Laser displays are used for many things, including optical layout templates. In a related application, a laser display can be used for entertainment applications, for example, to project company logos, animated cartoon figures and the like, and also to project directly into an audience. Lasers projected into an audience are referred to as "audience scanning."

When creating a displayed image of a company logo or cartoon, typically the "raw laser beam" is used directly out of the laser source, and then sent to X-Y scanners. Vector graphics being sent to the X-Y scanners from a computer then create an image on a target surface. Focusing, defocusing, or changing the beam diameter during the X-Y scanning is not typically done in laser display projectors known in the art. As a result, the image has a roughly constant size laser beam across the entire projection surface. However, it is desirable to have a device that provides variable focus or defocus capability, such that certain parts of the projected image can have a larger spot size (for example, big blushy cheeks on a woman's face) while other parts of the image can have a very small spot size (for example, eye lashes on a woman's face).

Likewise, when creating an audience scanning display, normally the raw laser beam is used right out of the laser, sent to an X-Y scanner, and then directly into the audience. In audience scanning laser projectors known in the art, focusing, defocusing, or changing the beam diameter of the X-Y scanning beam is typically not done. Therefore, just as in the case of a typical laser graphics projector discussed above, the entire audience receives the same diameter laser beam at all times and all places in the projected display. However, it is desirable to have a device that can provide variable focus or defocus such that parts of the image being created can have a higher beam diameter, and other parts can have a lower beam diameter. With audience scanning applications, this can be especially important because the safety of the laser beam is increased as the diameter of the laser beam is increased within the audience. If a variable focus device were used, it could increase the beam diameter for areas of the laser projection where audience members are particularly close to the laser projector, and thus safety features and benefits also increased.

Several devices are known that try to create a precision, variable-focus system for a laser beam. These devices have generally taken one of two forms. One form is where a normal galvanometer scanner (which is a rotary device) is employed into a system that uses a rotary-to-linear mechanical translator, such as a taut-band Rolamite. The motion of the moving member is then restricted such that it can only move axially, and not radially or rotationally, by a rod-bearing system. A lens or other optical element is then mounted to the moving member. In this way, an off-the-shelf galvanometer scanner can be used to move a lens in a linear fashion, instead of moving a mirror in a rotary fashion, as is typically the case for galvanometer scanners. Although galvanometer scanners are off-the-shelf devices, they really were not designed to be applied as lens translators. As a result, there are a number of problems with this technique. By way of example, the rod bearings eventually wear out, and also have limited maximum speeds. Further, the linkage between the rotary scanner shaft and linear sliding member cannot be made desirably stiff. Therefore, resonance problems will prevent the speed of such a device from being as high as desired.

Another approach for creating a precision, variable-focus system for a laser beam is to use a moving-coil actuator coupled to a rod-bearing system similar to that described above. The rod-bearing system allows the coil and moving optical element to move axially, but neither radially nor rotationally. Oftentimes, the lens is located in the center of the moving coil. Performance of this type of system is generally more desirable than the approach described above, but still not satisfactory for some applications, including laser display and audience scanning applications. In one particular known system, wherein the moving element and coil ride along a rod-bearing system, the maximum slew rate achievable is 1600 millimeters per second, and maximum acceleration is 50 G (e.g. $m/s^2$).

The use of a rod-bearing system provides a disadvantage for a Z-axis focusing system for certain applications. As a result, there have been attempts to replace the linear bearing system with flexures of various forms, such as a flat-spring flexure or even wires used to provide flexure. However, known flexure systems exhibit self-resonances that prevent the overall Z-axis focusing device from achieving speeds that are anywhere near the frequency of the flexure self-resonances.

In one configuration using metal flexures, an undesirable additional motion is imparted to the moving member. For example, one such approach uses three flat-spring flexures arranged in a triangular fashion. As the moving element is moved along the Z-axis, the flexures maintain axial motion while restricting radial motion. However, due to triangular and flat-spring nature, as the element is moved, a parasitic rotational motion is also imparted onto the member as it is moved axially. The net result appears as a "screwing" action, which is undesirable when compared with pure linear motion.

In another configuration commonly employed in CD and DVD drives, simple wires are used to restrict the motion of the moving element. However, the diameter of the wires must be quite small in order to allow axial motion, and thus the self-resonant frequency and stiffness in the radial direction are not sufficient for laser display or audience scanning applications.

Whether implemented as a rotary-to-linear device or a moving coil device, there is one thing that currently known systems have in common, and that is that the moving member itself has an undesirable amount of mass. For example, within industrial Z-axis focusing devices used for laser marking and cutting, the lowest typical moving mass typically available is at least 20 grams, and a moving mass of 50 grams is much more common. Such a high moving mass is detrimental to achieving very high speeds. Even with the in Z-axis focusing devices used in CD and DVD players, the moving mass is typically around 0.3 grams, which is a lot of mass when compared with the force that CD/DVD actuators produce (typically less than 0.2 Newtons). Thus, the frequency attainable by Z-axis focusing devices at present is insufficient for use within those applications that require very fast dynamic focus action, such as laser displays and audience scanning.

SUMMARY

One embodiment according to the teachings of the present invention advantageously overcomes problems of known Z-axis focusing devices by providing a rotating retro-reflector assembly which is light in weight and yet having sufficient stiffness to allow for high speed, repeatable motion. One embodiment may comprise a retro-reflector used in combination with a pair of fixed lenses, wherein a resulting device is able to rapidly change the focus or divergence of an incoming light beam. One embodiment according to the teachings of the present invention may comprise a light beam brush having a first lens positioned for receiving a beam of light propagating along a first beam axis and a retroreflector having first and second reflective surface portions, the first surface portion positioned for receiving the beam transmitted from the first lens and redirecting the beam onto the second reflective surface portion, wherein the retroreflector is rotatable about an axis or rotation. A second lens may be fixed at a position downstream the first lens for receiving a reflected light beam from the second reflective surface portion of the retroreflector for transmitting the beam along a second beam axis. A controller may be operable with the retroreflector for controlling an angle of rotation of the first and second reflective surfaces about the axis of rotation and thus controlling a path length change of the beam between the first lens and the second lens. The angle of rotation and thus path length change may be selected for providing a focus or divergence of the reflected beam transmitted through the second lens.

Further, one embodiment may comprise a pair of mirrors arranged as a retroreflector, wherein the retroreflector is attached to a rotary actuator in such a way that rotary motion creates a path length change between the first lens and the second lens, and wherein a command signal sent to the rotary actuator controls the angle of the actuator and thus controls a path length change.

Yet further, an X-Y scanner may be located downstream the first and second mirrors, wherein the command signal sent to the rotary actuator is sent to the X-Y scanner for compensating for any unwanted scanning action resulting from operation of the device.

BRIEF DESCRIPTION OF DRAWINGS

Embodiments of the invention are described by way of example with reference to the accompanying drawings in which.

DESCRIPTION OF EMBODIMENTS

The present invention will now be described more fully hereinafter with reference to the accompanying drawings, in which embodiments of the invention are shown by way of illustration and example. This invention may, however, be embodied in many forms and should not be construed as limited to the embodiments set forth herein. Rather, these embodiments are provided so that this disclosure will be thorough and complete, and will fully convey the scope of the invention to those skilled in the art.

Figure 1:
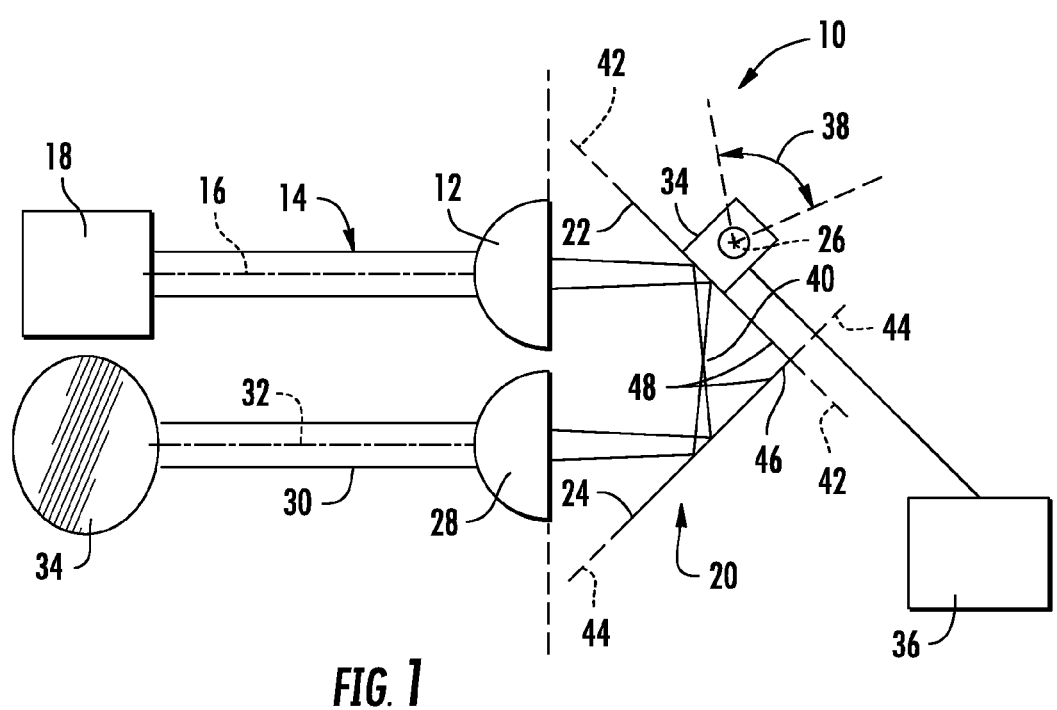
FIG. 1 is a diagrammatical illustration of one light beam brush embodiment according to the teachings of the present invention.

With reference initially to FIG. 1, one embodiment according to the teachings of the present invention is herein described as a light beam brush 10 comprising a first lens 12 positioned for receiving a light beam 14 propagating along a first beam axis 16. For embodiments herein presented by way of non-limiting example, the light beam is a laser beam emitted from a laser as a light beam source 18 as a collimated beam of light. A retroreflector 20, as herein described by way of example, includes first and second reflective surface 22, 24. The first reflective surface 22 is positioned for receiving the light beam 14 transmitted from the first lens 12 and redirecting the beam onto the second reflective surface 24. The retroreflector according to the teachings of the present invention is rotatable about an axis or rotation 26. A second lens 28 is held fixed at a position downstream the first lens 12 for receiving a reflected light beam 30 from the second reflective surface 24 of the retroreflector 20 and transmitting the reflected beam 30 along a second beam axis 32 towards a target 34, which target may be a screen, clouds in the atmosphere or as desired without departing from the teaching of the invention.

With continued reference to FIG. 1, a controller is operable with the retroreflector 20 for controlling an angle of rotation 38 of the first and second reflective surfaces 22, 24 about the axis of rotation 26 and thus controlling a path length change 40 of the beam between the first and second lenses 12, 28. The angle of rotation 38 about the axis of rotation 26 and thus the path length change 40 is selected for providing a desired focus or divergence of the reflected beam transmitted through the second lens 28.

For the embodiment herein presented by way of example and with continued reference to FIG. 1, the first and second reflective surfaces 22, 24 are fixed within first and second planes 42, 44 which planes intersect at an intersection 46. The axis of rotation 26 is generally close to either the first or second plane 42, 44 and offset from the intersection 46. For the embodiment herein illustrated for the embodiment of FIG. 1, the first and second reflective surfaces are planar and orthogonal to each other.

Figure 2:
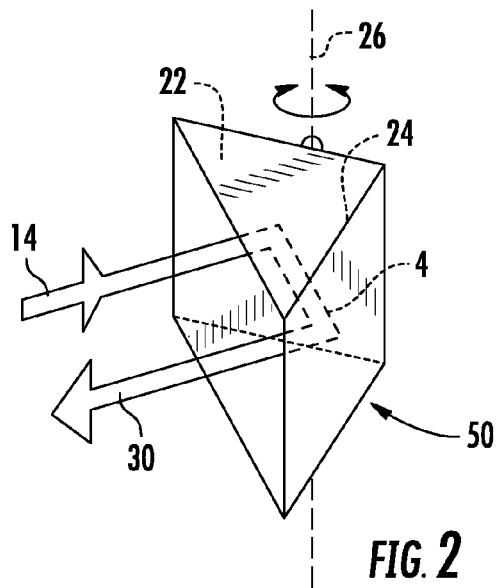
FIG. 2 is a diagrammatical illustration of a prism structure providing reflective surfaces for use in a retroreflector.
Figure 3:
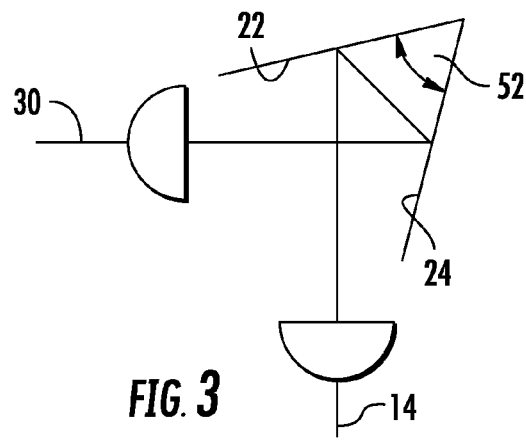
FIGS. 3 and 4 are diagrammatical illustrations of reflective surface useful in a retroreflector using a pair of mirror aligned at acute and obtuse angles, respectively; mirrors, wherein of another embodiment of invention, by way of example.
Figure 4:
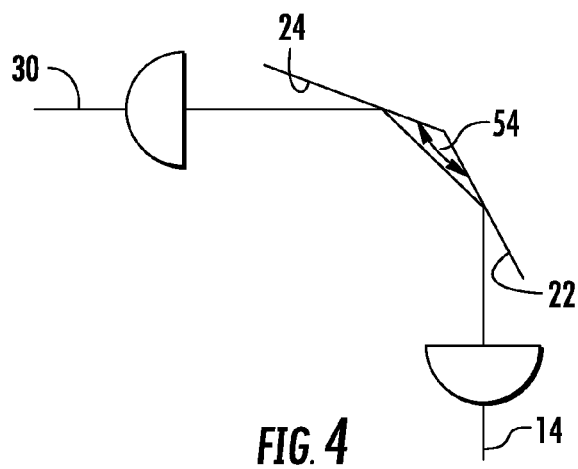
Figure 5:
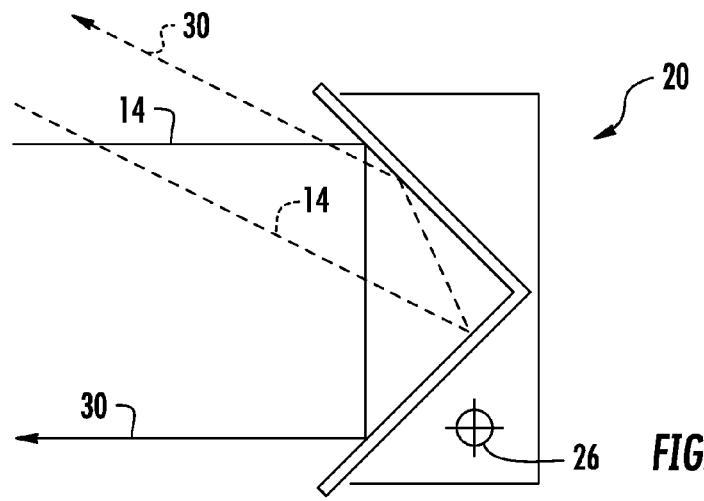
FIGS. 5, 6 and 7 are diagrammatical illustrations of two dimensional, three dimensional and circular reflective surfaces, respectively, useful in a retroreflector and possible incident and reflective beams operable therewith.
Figure 6:
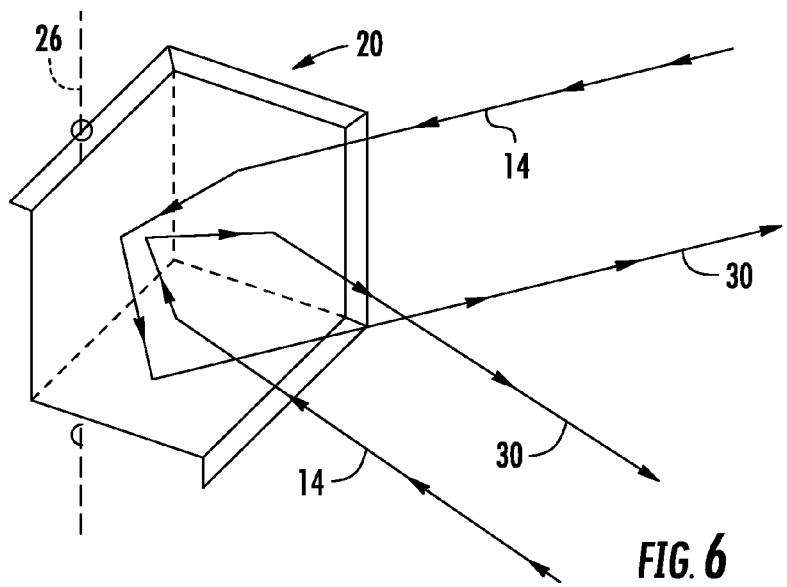
Figure 7:
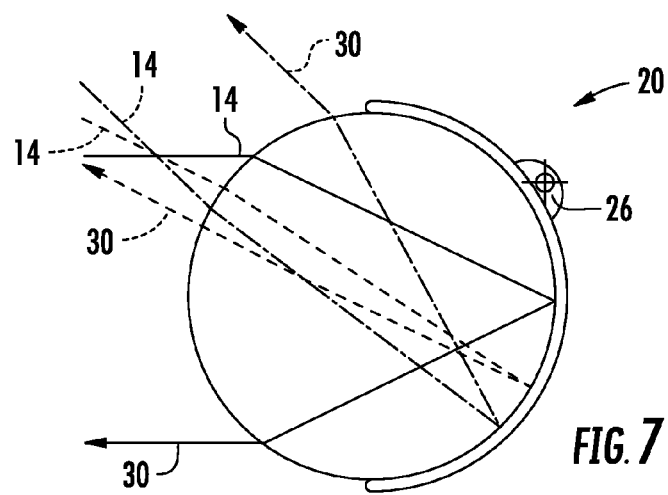

As illustrated with Reference to FIG. 2, the reflective surfaces 22, 24 may be surfaces of a prism 50. Alternatively, and as desired with regard to beam axes, the first reflective surface 22 may form an acute angle 52 or an obtuse angle 54 with the second reflective surface 24, as illustrated with reference to FIGS. 3 and 4, respectively. Yet further and as will come to the minds of those skilled in the art, various reflective surface configurations, shapes and beam angles incident upon this selected surfaces may be employed, as illustrated with reference to FIGS. 5, 6 and 7, without departing from the teachings of the present invention. As illustrated with reference again to FIG. 1, while the first beam axis 16 is parallel to the second beam axis 32, it may be desired to have them orthogonal to each other, as provided by the embodiments illustrated in FIGS. 3 and 4, by way of non-limiting example.

A fuller appreciation of the teachings of the invention will be realized by considering the teachings in the art. As illustrated with reference to FIG. 8, one known system is based on principle of creating a Newtonian telescope, and changing the path length through the telescope. Such a system includes a pair of lenses with positive focal length. Moving one lens toward the other results in an increase of divergence of the output beam, which is a desirable function when the system is used for laser display applications. Conversely, moving one lens away from the other will result in a focusing the output beam, which is a desirable function for laser marking and cutting operations. The distance between the two lenses will determine the degree of divergence increase or focusing. Moreover, if no divergence or focus change is desired, the two lenses can be placed at a distance equal to the sum of the focal lengths of the lenses.

Figure 8:
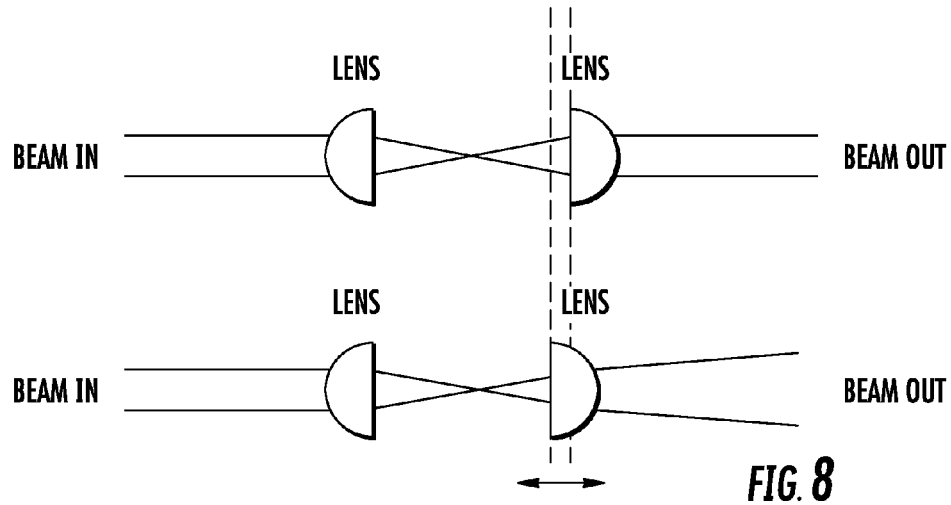
FIG. 8 is a diagrammatical illustration of a known Newtonian telescope arrangement including two lenses, and how moving one lens relative to the other may be used to affect a divergence or focus change to the incoming light beam.

FIG. 8 illustrates a path as being straight through the pair of lenses. As an alternative, this path may be folded, by employing the use of a retroreflector, as illustrated with reference to FIG. 9. The retroreflector includes a pair of mirrors, usually arranged at a 90-degree angle, so that an incoming light beam is reflected back toward an originating light beam direction.

Figure 9:
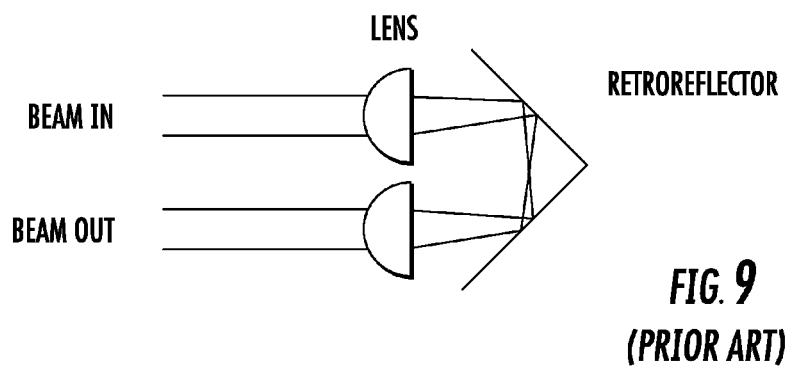
FIG. 9 is a diagrammatical illustration of how the Newtonian telescope of FIG. 8 may be rearranged using a retroreflector.
Figure 10:
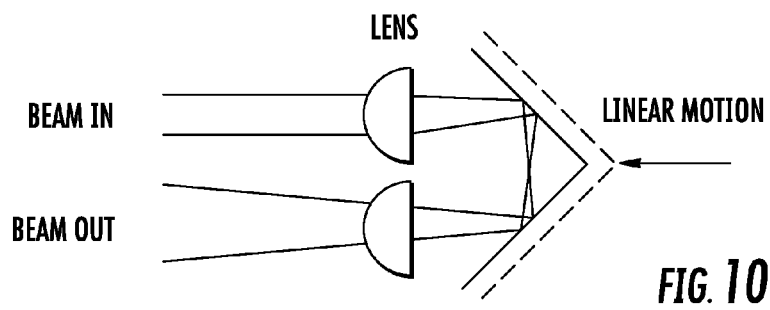
FIG. 10 is a diagrammatical illustration of how one may achieve a similar divergence or focus change as illustrated in FIG. 8 by moving the retroreflector of FIG. 9 instead of the lenses.

When the retro-reflector is employed as illustrated with continued reference to FIG. 9, and now to FIG. 10, the retroreflector may be moved in a linear fashion to affect the path length between the two lenses. This accomplishes the same result as moving the lenses themselves. While the embodiment of FIG. 10 is capable of changing the divergence or focus of an incoming light beam, there are challenges that create problems with linearly moving lenses and related structures. One major challenge is that an off-the-shelf actuator typically desired for use is not currently available for providing the degree of speed and precision typically required for demanding applications such as laser displays.

Analysis revealed that it is preferable to make a fast, precise rotary actuator than it is to make a fast, precise, linear actuator. In fact, relatively fast and precise rotary actuators are already in use for both laser display and laser marking/cutting applications in the form of galvanometer-based optical scanners. In the past, attempts have been made to use such a scanner for z-axis focusing and beam brush applications. These approaches have generally involved attaching a taut band to the scanner's shaft, configured as a rotary-to-linear converter, and having this band drive a shuttle that rides on roller bearings. Because of the complexity of this system, involving linear roller bearings and the taut band Rolamite, as earlier described, high speed positioning required for laser display applications is not achieved.

The teachings of the present invention as above initially described may be operable using a limited-rotation rotary actuator such as a galvanometer-based optical scanner, along with the retroreflector selectively positioned to achieve divergence increases and focus changing as required for the demanding display and laser marking/cutting applications. By way of further example with regard to the teachings of the present invention, attention is now directed to FIG. 11, wherein the light beam brush 10 includes the retroreflector 20 formed using a base 56 rotatable about the axis of rotation 26. With continued reference to FIG. 11 and now to FIG. 12, a first mirror 58 is mounted on the base 56 and aligned at a first alignment 60. The first mirror 58 includes the first reflective surface 22 above described with reference to FIG. 1. A second mirror 62 is mounted on the base 56 and spaced at a distance 64 from the first mirror 58. The space 64 between mirrors 58, 62 may be preselected to accommodate a desired path length change 40. The second mirror 62 is affixed to the base 56 and aligned at a second alignment 66 orientated orthogonal to the first alignment 60. The second mirror includes the second reflective surface 24 above described with reference to FIG. 1.

Figure 13:
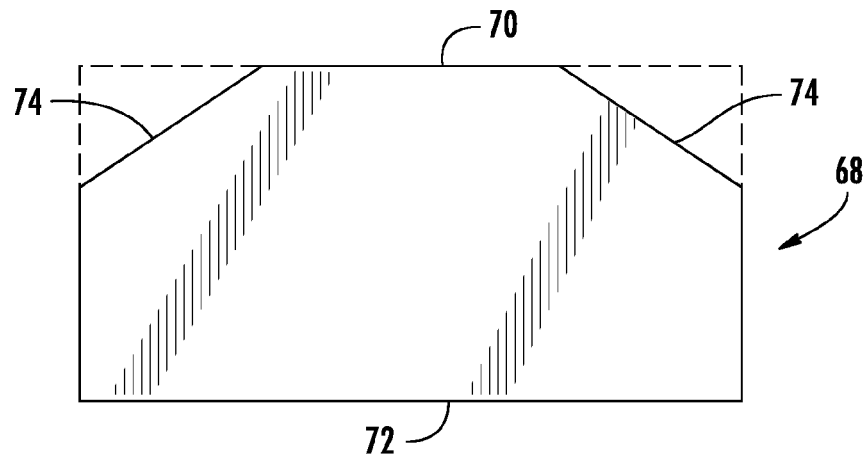
FIGS. 13 and 14 are plan and perspective views, respectively, of one mirror operable with the retroreflector of FIG. 11
Figure 14:
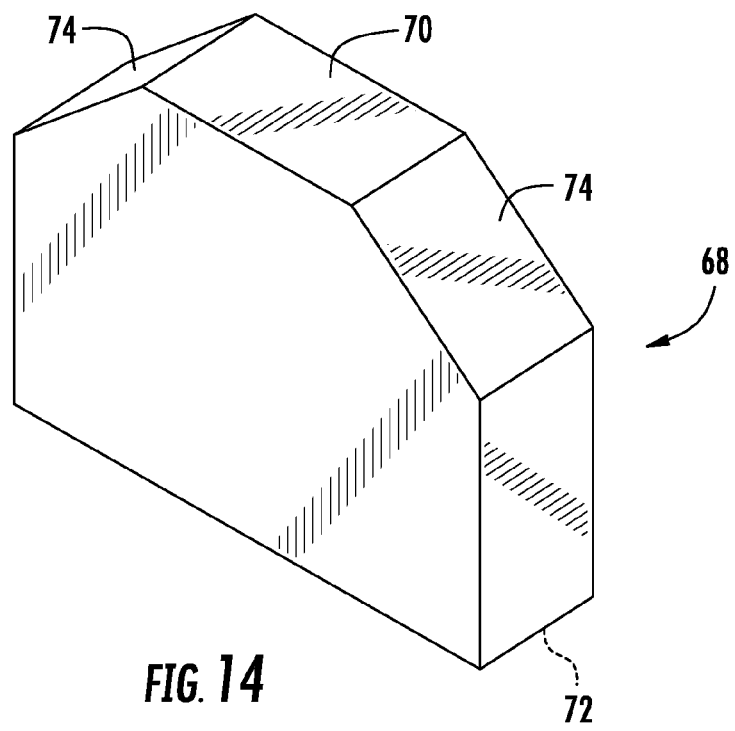

The first and second mirrors 58, 62 are generally rectangular in shape. However, to optimize weight and inertia as typically desired in laser scanning systems, each of the mirrors have their rectangular shapes including a center top portion 70 parallel to a bottom portion 72 and undercut 74 on top left and right sides, as illustrated with reference to FIGS. 13 and 14.

Figure 11:
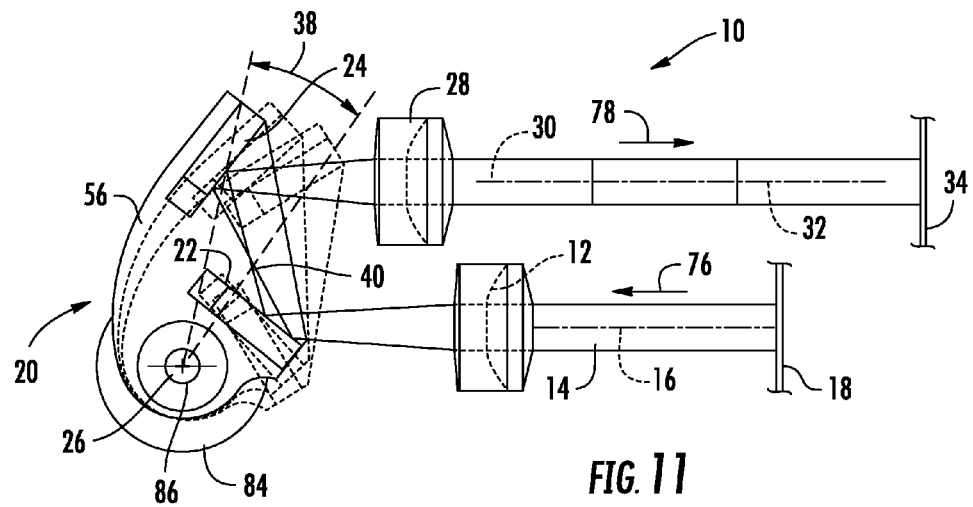
FIG. 11 is a diagrammatical illustration of the light beam brush of FIG. 1 illustrating use of mirrors on a base of the retroreflector is one possible arrangement.
Figure 12:
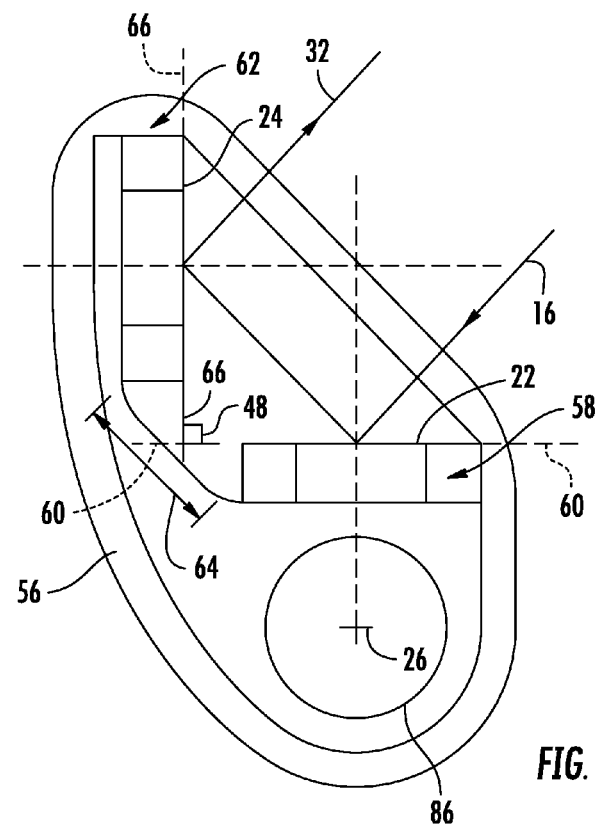
FIG. 12 is a plan view of the retroreflector of FIG. 11.

As illustrated with continued reference to FIG. 11 and as above described with reference to FIG. 1, the light beam 14 is transmitted in one direction 76 along the first beam axis 16 and the reflected beam 30 is transmitted in an opposite direction 78 along the second beam axis 32, with the second beam axis parallel to the first beam axis.

Figure 15:
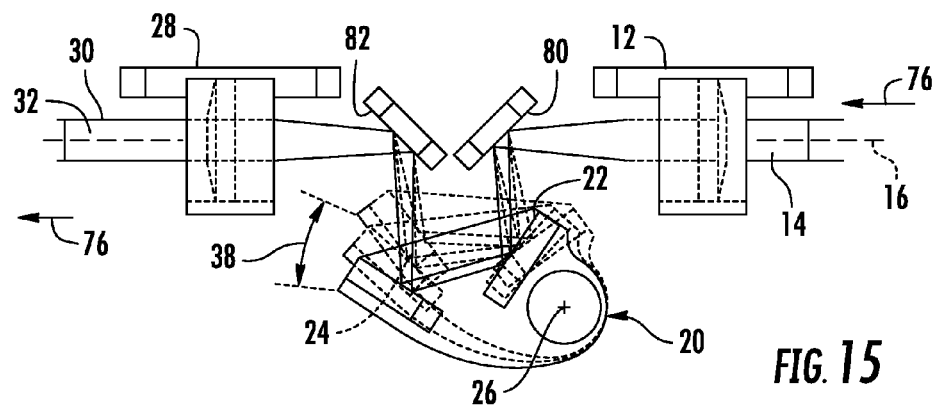
FIG. 15 is a diagrammatical illustration of the light beam brush according to the teachings of the present invention illustrating an embodiment providing the incident and reflected beams projected in the same direction as opposed to opposite directions as illustrated in FIG. 11.

Optionally, when a need exists to transmit the reflected beam in a similar direction as the initial beam while maintaining the focusing and diverging capability herein presented, the beam brush 10 may be modified to include additional reflective surfaces receiving the beam. By way of non-limiting example, and with reference to FIG. 15, the beam brush 10 further comprises a third reflective surface 80 positioned downstream the first lens 12 for receiving the beam 14 transmitted therefrom and reflecting the beam onto the first reflective surface 22 of the retroreflector 20. A fourth reflective surface 82 is positioned downstream the second reflective surface 24 for receiving the beam 30 reflected therefrom and reflecting the beam onto the second lens 28. For the example herein illustrated, the beam 30 transmitted along the second beam axis 32 is in the direction 76 of the beam 14 transmitted along the first beam axis 16. It will be understood by those of skill in the art, that while reference is made to a beam and a reflected beam, they are indeed the same beam being described as portion of that beam for convenience in illustration.

With reference again to FIG. 11, by way of example, the beam brush 10 further comprises a beam brush scanner 84 having a shaft 86 operable with the retroreflector 20 and rotatable about the axis of rotation 26. The controller 36, described earlier with reference to FIG. 1, is operable with the beam brush scanner 84 for providing control signals 88 limiting rotation of the retroreflector 20 about the axis of rotation 26.

Figure 16:
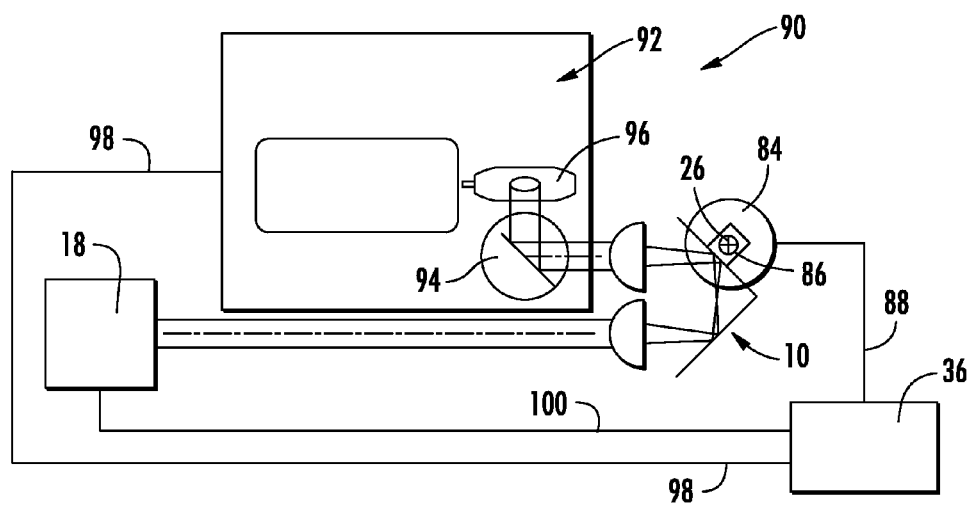
FIG. 16 is a diagrammatical illustration of an embodiment of the invention integrated within an X-Y scanning system.

One desirable use of the beam brush 10, herein described by way of example, is the value added when employed in a laser scanning system 90 illustrated, by way of example, with reference to FIG. 16. An X-Y scanner 92 may be located downstream the second lens 28 for receiving the light beam 30 having focus or divergent characteristics. The incoming light beam 14 passes through the first lens 12, then onto the first retroreflector mirror 58, then onto the second retroreflector mirror 62, then through the second lens 28, as above described, and then onto an X-axis mirror 94 for deflection. Finally, the beam 30 is reflected from the X-axis mirror 94 to the Y-axis mirror 96 where it is then projected outward onto the target 34 which may include a projection surface or work piece. The retroreflector may be arranged in a Z-axis to provide X, Y and Z scanning, thus providing a Z-axis focusing beam brush. For laser display applications, appropriate lenses may be approximately 12 mm focal length acromat lenses, and the galvanometer-based optical scanner used as the rotary actuator may be a low-inertia type, such as the model Saturn 5 from ScannerMAX.

The controller 36 may be operable for transmitting a signal 98 to the X-Y scanner 92 during the controlling of the angle of rotation 38 of the retroreflector 20 for scanning action compensation, as desired. As is well known by those of skill in the art, the collimated laser beam typically has a low divergence such that a beam diameter is generally maintained. The teachings of the present invention provide a desired control over such a laser beam. Yet further, the controller 36 may comprise processing software for transmitting operational commands 100 to the laser source, thus having the system 100 fully controlling a performance of a laser show, by way of example.

By way of further example and with reference again to FIGS. 11 and 12, the incoming light beam 14 passes through the first lens 12 and is directed toward the first mirror 58, which is part of the retroreflector 20. The first mirror 58 reflects the light beam 14 at a 90-degree angle toward the second mirror 62 of the retroreflector 20. The second mirror 62 then reflects that light beam at another 90-degree angle toward the second lens 28. The reflected outgoing beam 30 emanates from the second lens either diverged, focused, or unchanged, depending on the orientation (position, rotation, and thus distance) of the retroreflector from the first lens and the second lenses. The command signal is sent to the beam brush scanner 84 (a rotary actuator) onto which the retroreflector assembly is attached. This command signal controls the rotation angle of the rotary actuator 84, and thus can control the amount of divergence increase or amount of focusing action that occurs. Note that when the first mirror 58 is arranged at a 90-degree angle with respect to the second mirror 62, the pair of mirrors of the retroreflector will always reflect the light beam at a total of 180-degrees, thus sending the light beam back in the same direction from where it came, as above described.

At first glance and as a practical note, it might appear possible to use a single mirror instead of the retro-reflector having the pair of mirrors. Unlike a single mirror which, at a zero-degree angle of incidence, would also reflect an incoming light beam back in the direction from where it came, the retroreflector provides a shift in location, allowing the lenses 12, 28 to be separated. Moreover, as the angle of incidence of a single mirror changes, the angular direction of the reflected beam also changes. However, the retroreflector 20 whose pair of mirrors 58, 62 is arranged at an angle of 90 degrees will always reflect the light beam back toward the original direction, regardless of the rotational orientation of the retroreflector 20. Therefore, by placing the retroreflector 20 at a strategic axis of rotation 26, it is possible to create the same path length change 40 as would happen if the retroreflector 20 were used with a linear actuator, as above described with reference to FIG. 10.

It is therefore desirable to locate the axis of rotation 26 (a pivot point for the retroreflector mounted to a galvanometer shaft) at a point where the galvanometer shaft rotation will cause a change in path length and not merely a rotation of the retroreflector. For example, placing this pivot point at the intersection or apex where the two mirrors intersect (intersection 46 above described with reference to FIG. 1, or along the axis of this apex will only impart rotation to the retroreflector. The retroreflector will always reflect the incoming beam from the first lens by 180-degrees toward the second lens but without changing the distance that the beam traveled from lens 12 to lens 28. Placing the axis of rotation 26 offset from the intersection 46 will indeed affect the path length while the beam brush scanner 84 rotates the retroreflector 20. However, this placement of the axis of rotation 26 also presents an undesirably higher inertia to the scanner 84 since it places a center of mass of the retroreflector 20 farther from the axis of rotation of the shaft itself. In addition to the undesirable inertia increase, the distance between the incoming beam and outgoing beam will change as the retroreflector is rotated. When the beam passes through one or both lenses, this shift will result in an angular change. The rotation of the retroreflector also results in a parasitic scanning action of the light beam, which is undesirable. Therefore, the axis of rotation 26 must be chosen as a tradeoff between the amount of path length change perceived by the pair of lenses 12, 28, the inertia of the retroreflector 20, the amount of path length change 40 desired, and the resulting parasitic scanning.

Through testing and experimentation, it has been found that one desirable location for the axis of rotation 20 is proximate a location the where the beam 14 is reflected off of one of the mirrors 58, as illustrated with reference again to FIGS. 1, 11 and 12.

Note that even though the shift and parasitic scanning that results from a suboptimal pivot point placement, this shift and resulting scanning action is predictable, and may be tolerable in some applications. For applications that cannot tolerate the scanning action which results from the change in shift, this may be compensated by feeding forward a portion of the command signal which drives the rotary actuator to the X-Y scanners that are located downstream from the device. The command signal 98 that is fed to the X-Y scanners is adjusted such that the X-Y scanner 92 will provide a counter steering action. Thus, when the beam 30 finally reaches the target 34 (a projection surface or work piece), the beam spot location will not change as a result of the divergence increasing or focusing action.

Figure 17:
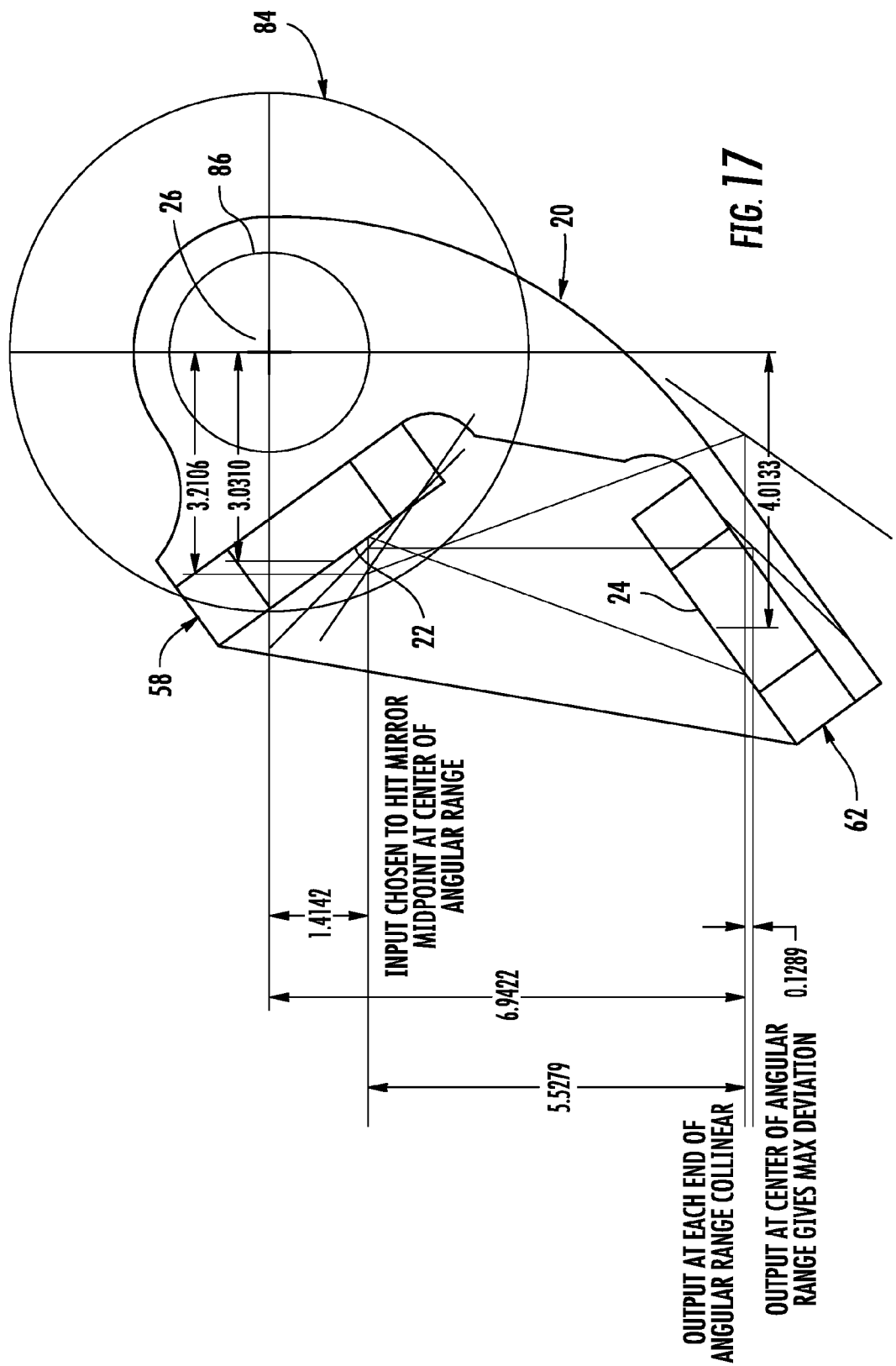
FIG. 17 is one embodiment of the retroreflector including one set of desired dimensions illustrated by way of non-limiting example.

By way of further example with regard to use, mounting the pair of mirrors 58, 62 of the retroreflector 20 on the shaft 86 of a galvanometer is relatively easy. The retroreflector 20 can be made from aluminum or even plastic and thus it is very light and stiff, allowing high-speed positioning of the assembly, and thus high speed divergence or focus action. With reference to FIG. 17, sample dimensions are presented illustrating one desirable orientation of the retroreflector mirrors. When embodiments involve changing the retroreflector from an arrangement that causes a 180-degree total path change to an arrangement that causes a 90-degree total path change, while realigned, the mirrors 58, 62 may be used and the principles herein presented remains the same.

Having now described the invention, the construction, the operation and use of preferred embodiments thereof, and the advantageous new and useful results obtained thereby, the new and useful constructions, and reasonable mechanical equivalents thereof obvious to those skilled in the art, are set forth in the appended claims.

That which is claimed is:

1. A light beam brush comprising:
   a first lens positioned for receiving a beam of light propagating along a first beam axis;
   a retroreflector having first and second reflective surface portions, the first surface portion positioned for receiving the beam transmitted from the first lens and redirecting the beam onto the second reflective surface portion, wherein the retroreflector is rotatable about an axis or rotation;
   a second lens fixed at a position downstream the first lens for receiving a reflected light beam from the second reflective surface portion of the retroreflector and transmitting the beam along a second beam axis; and
   a controller operable with the retroreflector for controlling an angle of rotation of the first and second reflective surfaces about the axis of rotation and thus controlling a path length change of the beam between the first lens and the second lens, the angle of rotation and thus path length change is selected for providing at least one of a focus and a divergence of the reflected beam transmitted through the second lens.

2. The light beam brush according to claim 1, wherein the first and second reflective surface portions are fixed within first and second planes, respectively, wherein the first and second planes intersect at an intersection, and wherein the axis of rotation is proximate one of the first and second planes and offset from the intersection thereof.

3. The light beam brush according to claim 2, wherein the first and second reflective surface portions are a planar, and wherein the first reflective surface portion is orthogonal to the second reflective surface portion.

4. The light beam brush according to claim 3, wherein the first and second reflective surfaces form a portion of a prism.

5. The light beam brush according to claim 4, wherein the first and second reflective surface portions are a planar, and wherein the first reflective surface portion forms at least one of an acute angle and an obtuse angle with the second reflective surface portion.

6. The light beam brush according to claim 5, wherein the first beam axis is orthogonal to the second beam axis.

7. The light beam brush according to claim 1, wherein the retroreflector comprises:
   a base rotatable about the axis of rotation;
   a first mirror carried by the base and aligned at a first alignment, the first mirror having the first reflective surface portion thereon; and
   a second mirror carried by the base in spaced relation to the first mirror, the second mirror affixed to the base and aligned at a second alignment orthogonal to the first alignment, the second mirror having the second reflective surface portion thereon.

8. The light beam brush according to claim 7, wherein each of the first and second mirrors comprises a rectangular shape having a center top portion parallel to a bottom portion and undercut left and right sides portions.

9. The light beam brush according to claim 1, wherein the first beam axis is parallel to the second beam axis.

10. The light beam brush according to claim 9, wherein the beam transmitted along the second beam axis is in an opposite direction from the beam transmitted along the first beam axis.

11. The light beam brush according to claim 1, further comprising:
    a third reflective surface portion positioned downstream the first lens for receiving the beam transmitted therefrom and reflecting the beam onto the first reflective surface of the retroreflector; and
    a fourth reflective surface portion positioned downstream the second reflective surface portion for receiving the beam reflected therefrom and reflecting the beam onto the second lens.

12. The light beam brush according to claim 11, wherein the beam transmitted along the second beam axis is in a direction of the beam transmitted along the first beam axis.

13. The light beam brush according to claim 1, further comprising a beam brush scanner having a shaft operable with the retroreflector and rotatable about the axis of rotation.

14. The light beam brush according to claim 13, wherein the controller is operable with the beam brush scanner for providing control signals thereto, and wherein the control signals limit rotation of the retroreflector about the axis of rotation.

15. The light beam brush according to claim 1, further comprising an X-Y scanner located downstream the second lens for receiving the light beam therefrom.

16. The light beam brush according to claim 15, wherein a signal is sent to the X-Y scanner during the controlling of the angle of rotation of the first and second reflective surfaces for scanning action compensation.

17. The light beam brush according to claim 1, wherein the beam of light is a collimated beam of light having as a low divergence such that a beam diameter is generally maintained.

18. The light beam brush according to claim 17, wherein the collimated beam is a laser beam.

19. A light beam brush comprising:
- a first lens fixed for receiving a laser beam propagating along a first beam axis;
- a retroreflector positioned for receiving the laser beam and redirecting the beam onto a second beam axis through a change in beam path length, wherein the retroreflector is rotatable about an axis or rotation;
- a second lens fixed within the second beam axis for receiving the redirected beam from the retroreflector and transmitting the redirected beam therefrom; and
- a controller operable with the retroreflector for controlling an angle of rotation thereof so as to affect the change in beam path length, wherein the angle of rotation resulting in the path length change is selected for providing at least one of a focus and a divergence of the reflected beam transmitted through the second lens.

20. The light beam brush according to claim 19, wherein the retroreflector comprises first and second reflective surface portions fixed within first and second planes, respectively, wherein the first and second planes intersect at an intersection, and wherein the axis of rotation is proximate one of the first and second planes and offset from the intersection thereof.

21. The light beam brush according to claim 20, wherein the first and second reflective surface portions are planar, and wherein the first reflective surface portion is orthogonal to the second reflective surface portion.

22. The light beam brush according to claim 20, wherein the first and second reflective surface portions are planar, and wherein the first reflective surface portion forms at least one of an acute angle and an obtuse angle with the second reflective surface portion.

23. The light beam brush according to claim 19, wherein the first beam axis is parallel to the second beam axis.

24. The light beam brush according to claim 23, wherein the laser beam transmitted along the second beam axis is in an opposite direction from the laser beam transmitted along the first beam axis.

25. The light beam brush according to claim 19, wherein the retroreflector comprises:
- a base rotatable about the axis of rotation;
- a first mirror carried by the base and aligned at a first alignment; and
- a second mirror carried by the base in spaced relation to the first mirror, the second mirror affixed to the base and aligned at a second alignment orthogonal to the first alignment.

26. The light beam brush according to claim 25, wherein each of the first and second mirrors comprises a rectangular shape having a center top portion parallel to a bottom portion and undercut left and right sides portions.

27. The light beam brush according to claim 25, further comprising:
- a third mirror positioned downstream the first lens for receiving the laser beam transmitted therefrom and reflecting the laser beam onto the first mirror; and
- a fourth mirror positioned downstream the second mirror for receiving the laser beam reflected therefrom and reflecting the laser beam onto the second lens.

28. The light beam brush according to claim 27, wherein the laser beam transmitted along the second beam axis is in a direction of the laser beam transmitted along the first beam axis.

29. The light beam brush according to claim 19, further comprising a beam brush scanner having a shaft operable with the retroreflector for providing the rotation about the axis of rotation.

30. The light beam brush according to claim 29, further comprising an X-Y scanner located downstream the second lens for receiving the laser beam therefrom, wherein the controller is operable with the beam brush scanner and the X-Y scanner for providing controls signals thereto, and wherein a signal is sent to the X-Y scanner during the controlling of the angle of rotation of the retroreflector for scanning action compensation.

* * * * *